US011809141B2

(12) United States Patent

Sridharan et al.

(10) Patent No.: US 11,809,141 B2

(45) Date of Patent: Nov. 7, 2023

(54) TIME-TO-DIGITAL CONVERTER USING VOLTAGE AS A REPRESENTATION OF TIME OFFSET

(71) Applicant: Anokiwave, Inc., San Diego, CA (US)

(72) Inventors: Kartik Sridharan, San Diego, CA (US); Jun Li, San Diego, CA (US); Eythan Familier, San Diego, CA (US); Gaurav Menon, San Marcos, CA (US); Shamsun Nahar, San Diego, CA (US); Akhil Garlapati, San Diego, CA (US); Scott Humphreys, Greensboro, NC (US); Antonio Geremia, San Diego, CA (US)

(73) Assignee: Anokiwave, Inc., San Diego, CA (US)

( * ) Notice: Subject to any disclaimer, the term of this patent is extended or adjusted under 35 U.S.C. 154(b) by 0 days.

(21) Appl. No.: 17/683,928

(22) Filed: Mar. 1, 2022

(65) Prior Publication Data

US 2022/0283550 A1 Sep. 8, 2022

Related U.S. Application Data

(60) Provisional application No. 63/155,376, filed on Mar. 2, 2021.

(51) Int. Cl.
*H03M 1/02* (2006.01)
*G04F 10/00* (2006.01)

(52) U.S. Cl.
CPC .................................. *G04F 10/005* (2013.01)

(58) Field of Classification Search
CPC ............................. G04F 10/005; G04F 10/105
USPC .......................................................... 341/108
See application file for complete search history.

(56) References Cited

U.S. PATENT DOCUMENTS 10,725,433 B2 * 7/2020 Fujimoto ................ H03L 7/085
2018/0005579 A1 * 1/2018 Brahma ............... G09G 3/3258

* cited by examiner

*Primary Examiner* — Jean B Jeanglaude

(74) *Attorney, Agent, or Firm* — Nutter McClennen & Fish LLP

(57) ABSTRACT

A time-to-digital converter (TDC) uses voltage as a representation of time offset. A voltage change is induced over a time period from a start signal to a stop signal. The final voltage is then measured, and the voltage measurement is mapped to a time value representing the time between the start signal and the stop signal. The voltage change can be increasing or decreasing, e.g., by charging or discharging a capacitive circuit between the start signal and the stop signal. The voltage can be measured using an analog-to-digital converter (ADC) or other voltage measurement circuit. The voltage measurement can be mapped to the time value in any manner, such as, for example, using a transfer function or using a mapping table that provides a time value for each possible voltage measurement value.

18 Claims, 11 Drawing Sheets

TIME-TO-DIGITAL CONVERTER USING VOLTAGE AS A REPRESENTATION OF TIME OFFSET

CROSS-REFERENCE TO RELATED APPLICATION(S)

This patent application claims the benefit of United States Provisional Patent Application No. 63/155,376 entitled TIME-TO-DIGITAL CONVERTER USING VOLTAGE AS A REPRESENTATION OF TIME OFFSET filed Mar. 2, 2021, which is hereby incorporated herein by reference in its entirety.

The subject matter of this patent application may be related to the subject matter of commonly-owned U.S. Patent Application No. 62/875,984 entitled PHASE-ALIGNING MULTIPLE SYNTHESIZERS filed on Jul. 19, 2019, and U.S. patent application Ser. No. 16/932,187 PHASE-ALIGNING MULTIPLE SYNTHESIZERS filed on Jul. 17, 2020 published as U.S. Patent Application Publication No. US 2021/0021402, both of which are hereby incorporated herein by reference in their entireties.

The subject matter of this patent application also may be related to the subject matter of commonly-owned U.S. Patent Application No. 63/155,374 entitled CALIBRATING A TIME-TO-DIGITAL CONVERTER filed on Mar. 2, 2021, which is hereby incorporated herein by reference in its entirety.

FIELD OF THE INVENTION

The invention generally relates to a time-to-digital converter (TDC) that uses voltage as a representation of time offset.

BACKGROUND OF THE INVENTION

A time-to-digital converter (TDC) captures the time difference between two signals and produces a digital output value representative of the time difference. One common type of TDC is the Vernier delay line (VDL) type of time-to-digital converter (TDC).

SUMMARY OF VARIOUS EMBODIMENTS

In accordance with one embodiment of the invention, a time-to-digital conversion system comprises first circuitry configured to capture the time difference between the two signals as the voltage and second circuitry configured to produce a digital output value representative of the time difference between the two signals based on the voltage. In various alternative embodiments, the first circuitry may include a time-to-voltage converter circuit configured to output a voltage signal that is proportional to the time difference between the two signals and a voltage measurement circuit configured to output a voltage measurement value based on the voltage signal, and the second circuitry may include a mapping circuit configured to output a time value based on the voltage measurement value. The time-to-voltage converter circuit may include an integrate-and-dump circuit. Alternatively, the time-to-voltage converter circuit may include a controllable current source (e.g., a flip-flop circuit or a latch circuit) configured to start an output current flow in response to a first signal of the two signals and to stop the current output flow in response to a second signal of the two signals and a capacitive circuit (e.g., a capacitor, a capacitor network, or an integrate-and-dump circuit) coupled to the controllable current source and configured to store voltage based on the current output flow from the controllable current source. Alternatively, the time-to-voltage converter circuit may include a flip-flop circuit configured to produce a start signal in response to a first signal of the two signals and to produce a stop signal in response to a second signal of the two signals and an integrate-and-dump circuit configured to begin integrating on the start signal and to stop integrating on the stop signal. The voltage measurement circuit may include an analog-to-digital converter to quantize the voltage signal. The mapping circuit may implement a transfer function circuit that maps the voltage measurement value to a corresponding time value or may include a mapping table that maps voltage measurement values to corresponding time values such that the mapping table can be indexed by the voltage value to obtain the corresponding time value. The captured voltage may correspond to a voltage increase during the time difference or may correspond to a voltage drop during the time difference. The voltage measurement value and the digital output value may correspond to a phase offset between the two signals. The system may include an integrated circuit that includes the first circuitry and the second circuitry or may include an integrated circuit that includes first circuitry and a separate apparatus that includes the second circuitry.

In accordance with another embodiment of the invention, a time-to-digital conversion method comprises capturing a time difference between two signals as a voltage and producing a digital output value representative of the time difference between the two signals based on the voltage.

In various alternative embodiments, capturing a time difference between two signals as a voltage comprises producing a voltage signal that is proportional to the time difference between the two signals, and producing a digital output value representative of the time difference between the two signals based on the voltage comprises producing a voltage measurement value based on the voltage signal and outputting a time value based on the voltage measurement value. Producing a voltage signal that is proportional to the time difference between the two signals may involve starting a voltage capture operation in response to a first signal of the two signals and stopping the voltage capture operation in response to a second signal of the two signals. The captured voltage may correspond to a voltage increase during the time difference or may correspond to a voltage drop during the time difference. The digital output value may correspond to a phase offset between the two signals.

Additional embodiments may be disclosed and claimed.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

It should be noted that the foregoing figures and the elements depicted therein are not necessarily drawn to consistent scale or to any scale. Unless the context otherwise suggests, like elements are indicated by like numerals.

DESCRIPTION OF ILLUSTRATIVE EMBODIMENTS

Embodiments of the present invention implement a time-to-digital converter (TDC) using voltage as a representation of time offset. Specifically, a voltage change is induced over a time period from a start signal to a stop signal. The final voltage is then measured, and the voltage measurement is mapped to a time value representing the time between the start signal and the stop signal. The voltage change can be increasing or decreasing, e.g., by charging or discharging a capacitive circuit between the start signal and the stop signal. The voltage can be measured using an analog-to-digital converter (ADC) or other voltage measurement circuit. The voltage measurement can be mapped to the time value in any manner, such as, for example, using a transfer function (e.g., T=F(V), where T is time, V is the final voltage measurement, and F(V) is the transfer function) or using a mapping table that provides a time value for each possible voltage measurement value.

Figure 1:
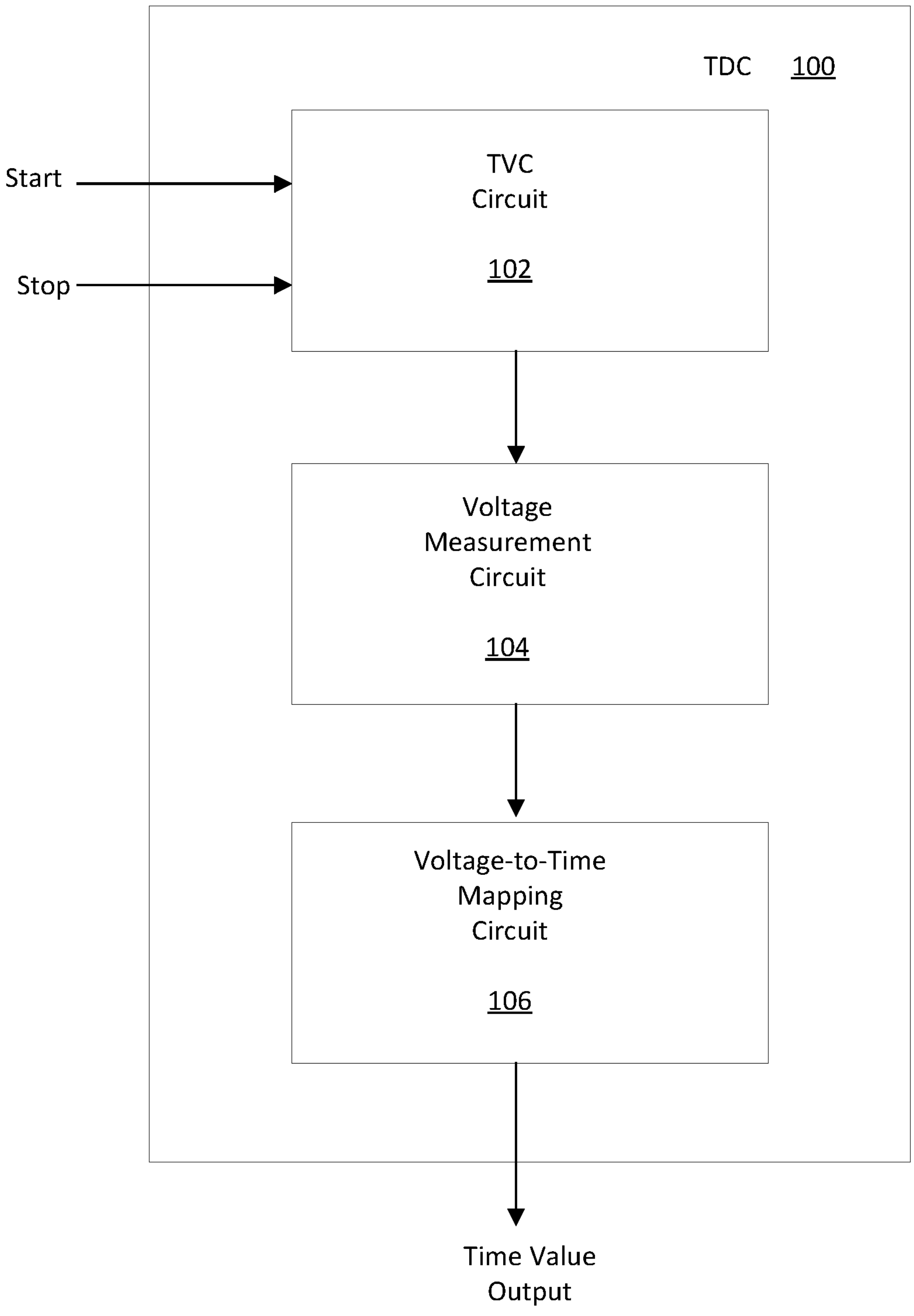
FIG. 1 is a schematic diagram showing a time-to-digital converter (TDC), in accordance with certain exemplary embodiments.

FIG. 1 is a schematic diagram showing a time-to-digital converter (TDC) 100, in accordance with certain exemplary embodiments. Among other things, the TDC 100 includes a time-to-voltage converter (TVC) circuit 102, a voltage measurement circuit 104, and a voltage-to-time mapping circuit 106. As discussed above, the TVC circuit 102 induces a voltage change over a time period from a start signal to a stop signal and outputs a voltage signal to the voltage measurement circuit 104. The voltage measurement circuit 104 outputs a voltage measurement value based on the voltage signal, e.g., a digital value representative of the final voltage. The voltage-to-time mapping circuit 106 maps the voltage measurement value to a time value representing the time between the start signal and the stop signal. The voltage change induced by the TVC circuit 102 can be increasing or decreasing, e.g., by charging or discharging a capacitive circuit between the start signal and the stop signal. The voltage measurement circuit 104 include an analog-to-digital converter (ADC) or other voltage measurement circuit to produce the voltage measurement value. The voltage-to-time mapping circuit 106 can map the voltage measurement value to the time value in any manner, such as, for example, using a transfer function (e.g., T=F(V), where T is time, V is the final voltage measurement, and F(V) is the transfer function) or using a mapping table that provides a time value for each possible voltage measurement value. The time value can be an absolute time value or a compensation value to be combined with the voltage measurement value (e.g., a delta value).

Figure 2:
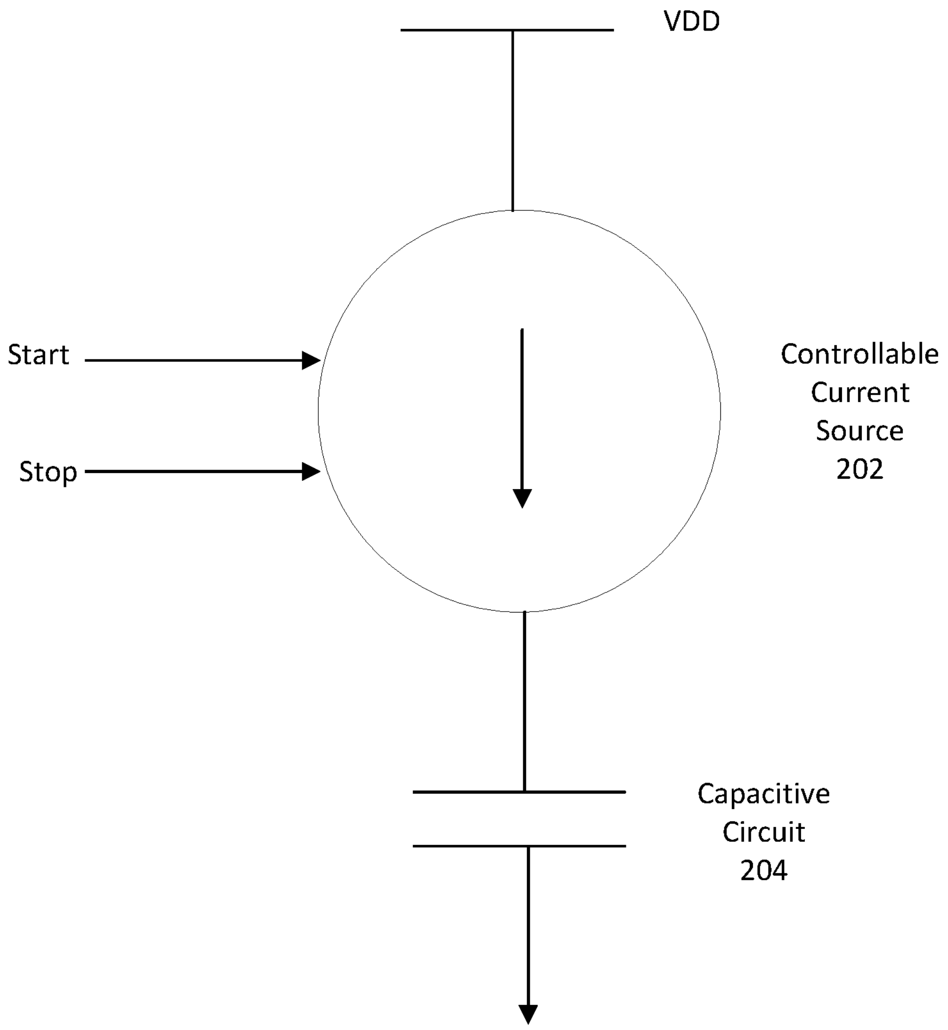
FIG. 2 is a conceptual schematic diagram of the TVC circuit, in accordance with certain exemplary embodiments.

FIG. 2 is a conceptual schematic diagram of the TVC circuit 102, in accordance with certain exemplary embodiments. Among other things, this TVC circuit 102 includes a controllable current source 202 and a capacitive circuit 204. The controllable current source 202 can be a flip-flop circuit, a latch circuit, or other controllable current source circuit. The capacitive circuit 204 can be a capacitor, a capacitive network, an integrate-and-dump circuit, or other capacitive circuit. In this example, the longer the time between the start signal and the stop signal, the more voltage will be stored in the capacitive circuit and hence the larger the final voltage will be, although alternative embodiments can induce a voltage drop such as by starting with a fully charged capacitive circuit and allowing the capacitive circuit to discharge between the start signal and the stop signal.

In certain exemplary embodiments, the TVC circuit is implemented using a new integrate-and-dump sampler in which a charge pump sinks the charge on a sampling capacitor during the time between the start signal and the stop signal (e.g., the phase offset between the two signals), which makes the delta in voltage proportional to the time between the start and stop signals. In certain exemplary embodiments, a conventional analog-to-digital converter (ADC) is used to quantize the voltage signal.

Figure 3:
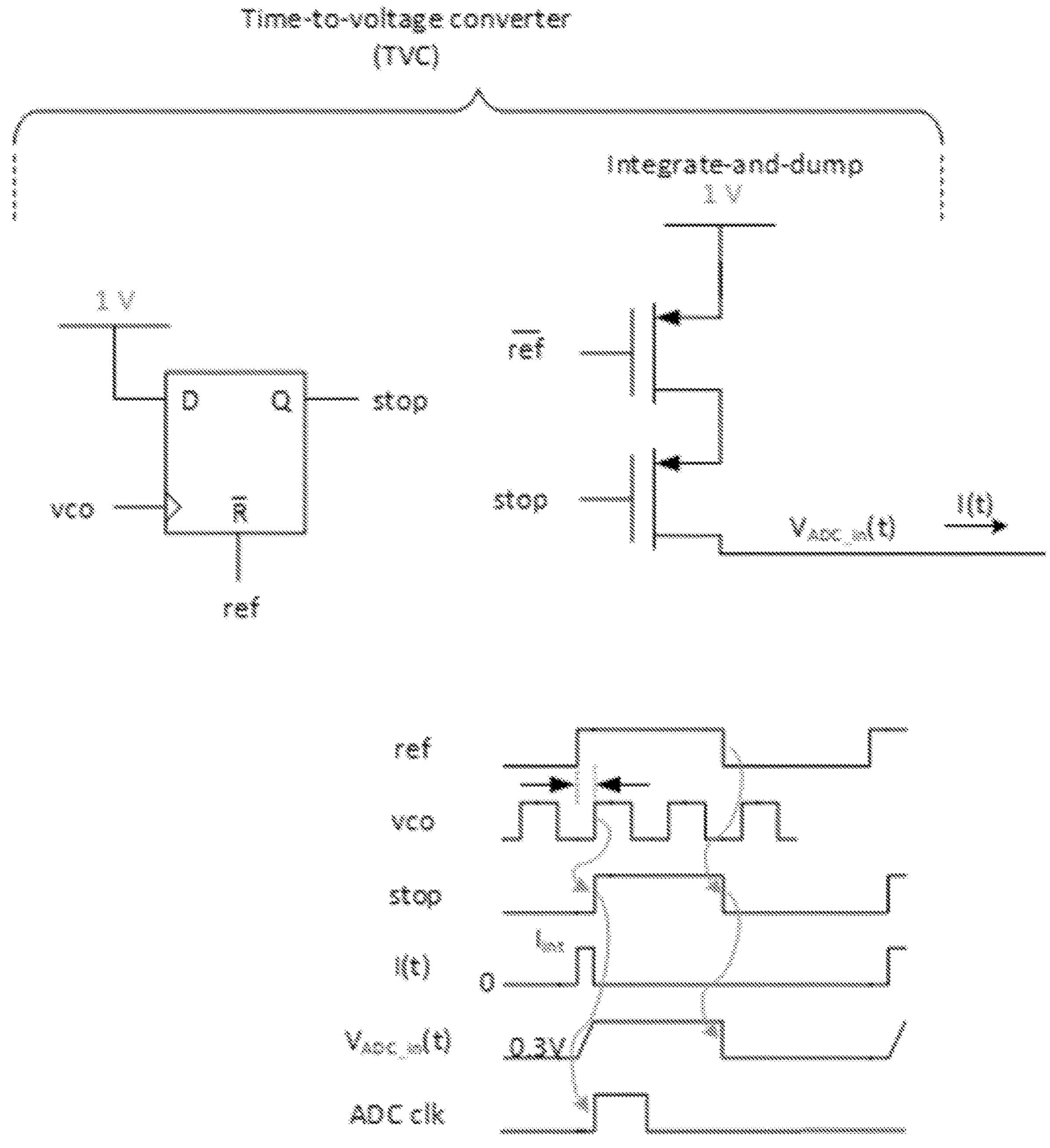
FIG. 3 is a schematic diagram of a first time-to-voltage converter (TVC) circuit, in accordance with certain exemplary embodiments.

FIG. 3 is a schematic diagram of a first time-to-voltage converter (TVC) circuit, in accordance with certain exemplary embodiments. This TVC circuit includes a flip-flop circuit and an integrate-and-dump circuit. This flip-flop circuit produces a start signal on the rising edge of the ref signal and produces a stop signal on the first rising edge of the vco signal following the start signal. The integrate-and-dump circuit begins integrating on the start signal and stops integrating on the stop signal. The final voltage output from the integrate-and-dump circuit is passed to the voltage measurement circuit.

Figure 4:
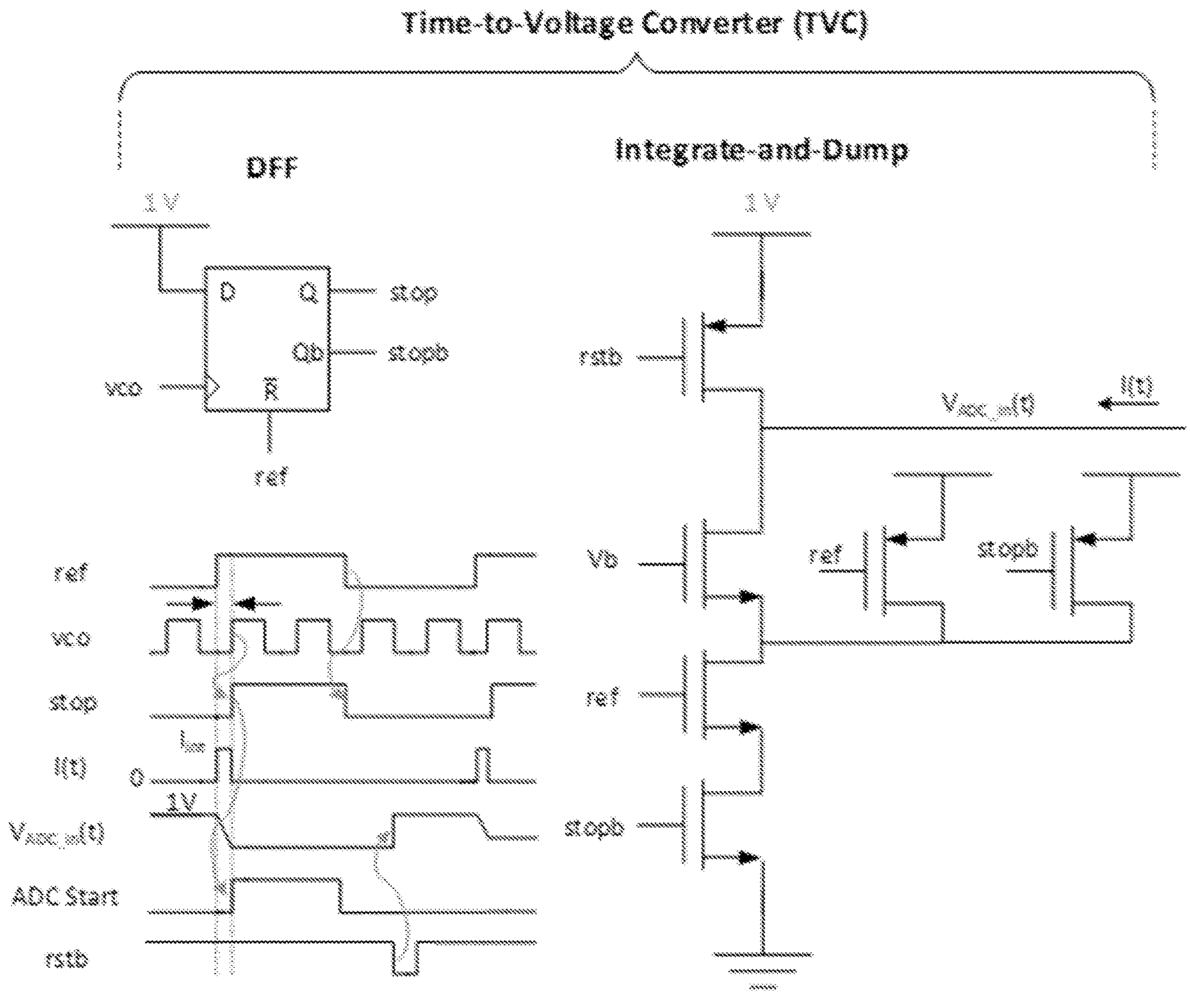
FIG. 4 is a schematic diagram of a second time-to-voltage converter (TVC) circuit, in accordance with certain exemplary embodiments.

FIG. 4 is a schematic diagram of a second time-to-voltage converter (TVC) circuit, in accordance with certain exemplary embodiments. This TVC circuit includes a flip-flop circuit and an integrate-and-dump circuit. The start signal is on the rising edge of the ref signal and the flip-flop circuit produces a stop signal on the first rising edge of the vco signal following the start signal. The integrate-and-dump circuit begins integrating on the start signal and stops integrating on the stop signal. I(t) refers to the current flowing out of the charging capacitor. This is when the capacitor is charged to a high voltage and then discharges through the TVC. The output is a voltage that is passed to the voltage measurement circuit.

Figure 5:
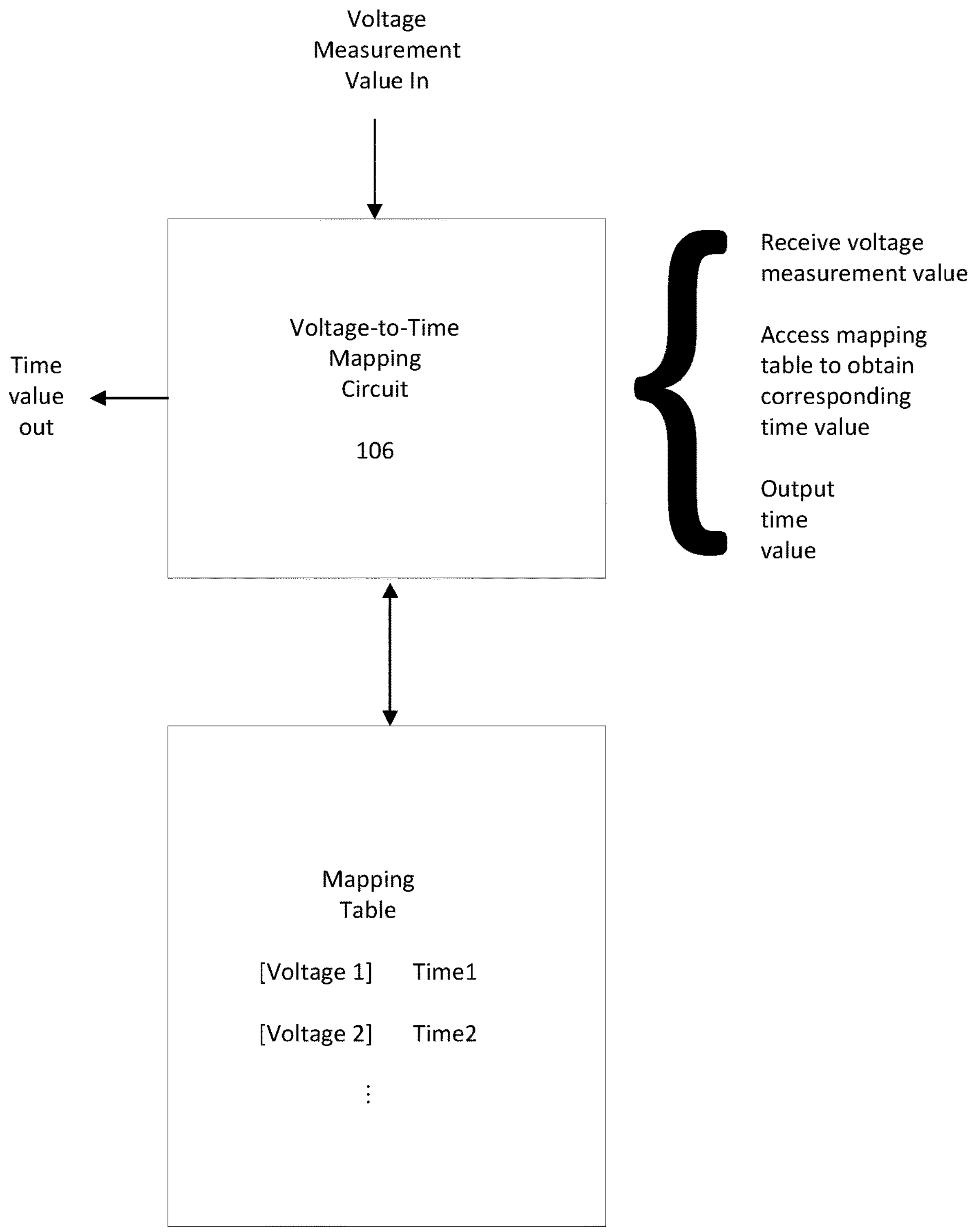
FIG. 5 is a schematic diagram showing the voltage-to-time mapping circuit implemented using a mapping table, in accordance with certain exemplary embodiments.

FIG. 5 is a schematic diagram showing the voltage-to-time mapping circuit 106 implemented using a mapping table, in accordance with certain exemplary embodiments. In this example, the mapping table, which is stored in a memory, stores a time value for each possible voltage value such that the table can be indexed by the voltage measurement value in order to obtain the corresponding time value. The voltage-to-time mapping circuit 106 receives the voltage measurement value from the voltage measurement circuit 104, accesses the mapping table to obtain the corresponding time value, and outputs the time value. The time values in the mapping table can be stored as part of a calibration operation, for example, as described in 4181-13403, which was incorporated by reference above. This calibration operation can be performed once or at various times, e.g., to compensate for fluctuations that can occur over time such as from component aging, temperature changes, etc. The mapping table can be part of the voltage-to-time mapping circuit or can be separate from the voltage-to-time mapping circuit, e.g., stored in a separate memory.

It is anticipated that TDCs of the types described herein will provide high-speed phase offset (time) sampling with lower power consumption, smaller circuit area, better linearity, and better noise performance than conventional delay line based TDCs.

It is anticipated that TDCs of the types described herein can be configured for use in a wide range of applications (e.g., for phase synchronization in high-performance 5G systems such as discussed in 4181.12901, which was incorporated by reference above, and for phase synchronization in clock distribution systems such as in high-speed wireline-like data center I/O systems) and in virtually any form (e.g., implemented as stand-alone TDC integrated circuit devices, implemented as part of larger integrated circuits, implemented using discrete components, etc. For example, it is envisioned that TDCs of the types described herein can be used as part of the phase measurement circuit described in 4181-12901 and 4181-12903, which were incorporated by reference above, to measure the time difference between a reference signal and a synthesizer output signal where a first event, such as a rising edge of the reference signal, acts as the start signal and a second event, such as a subsequent rising edge of the synthesizer output signal, acts as the stop signal. The TDC outputs a digital value representing the time difference between the two events. It also is envisioned that TDC calibration techniques discussed in 4181-13403, which was incorporated by reference above, can be applied to TDCs of the types described herein such as to configure the mapping table that provides a time value for each possible voltage measurement value, e.g., as described with reference to FIG. 7.

It should be noted that time-to-digital converters and related calibration and operational systems and methods can be used in a wide variety of applications. Various embodiments can be used in the context of active electronically steered antenna (AESA) systems also called Active Antenna, although the present invention is in no way limited to AESA systems. AESA systems form electronically steerable beams (sometimes referred to as "beam forming" or "BF") that can be used for a wide variety of applications. Generally speaking, a "beam-formed signal" is a signal produced by or from a plurality of beam forming elements. A "beam forming element" (sometimes referred to simply as an "element" or "radiating element") is an element that is used to transmit and/or receive a signal for beam forming. Different types of beam forming elements can be used for different beam forming applications. For example, the beam forming elements may be RF antennas for RF applications (e.g., radar, wireless communication system such as 5G applications, satellite communications, etc.), ultrasonic transducers for ultrasound applications, optical transducers for optical applications, microphones and/or speakers for audio applications, etc. Typically, the signal provided to or from each beam forming element is independently adjustable, e.g., as to gain/amplitude and phase. In the context of the present invention, there is no requirement that a beam-formed signal have any particular characteristics such as directionality or coherency. Although certain details of various embodiments of an AESA system are discussed below, those skilled in the art can apply some embodiments to other AESA systems. Accordingly, discussion of an AESA system does not necessarily limit certain other embodiments.

Figure 6:
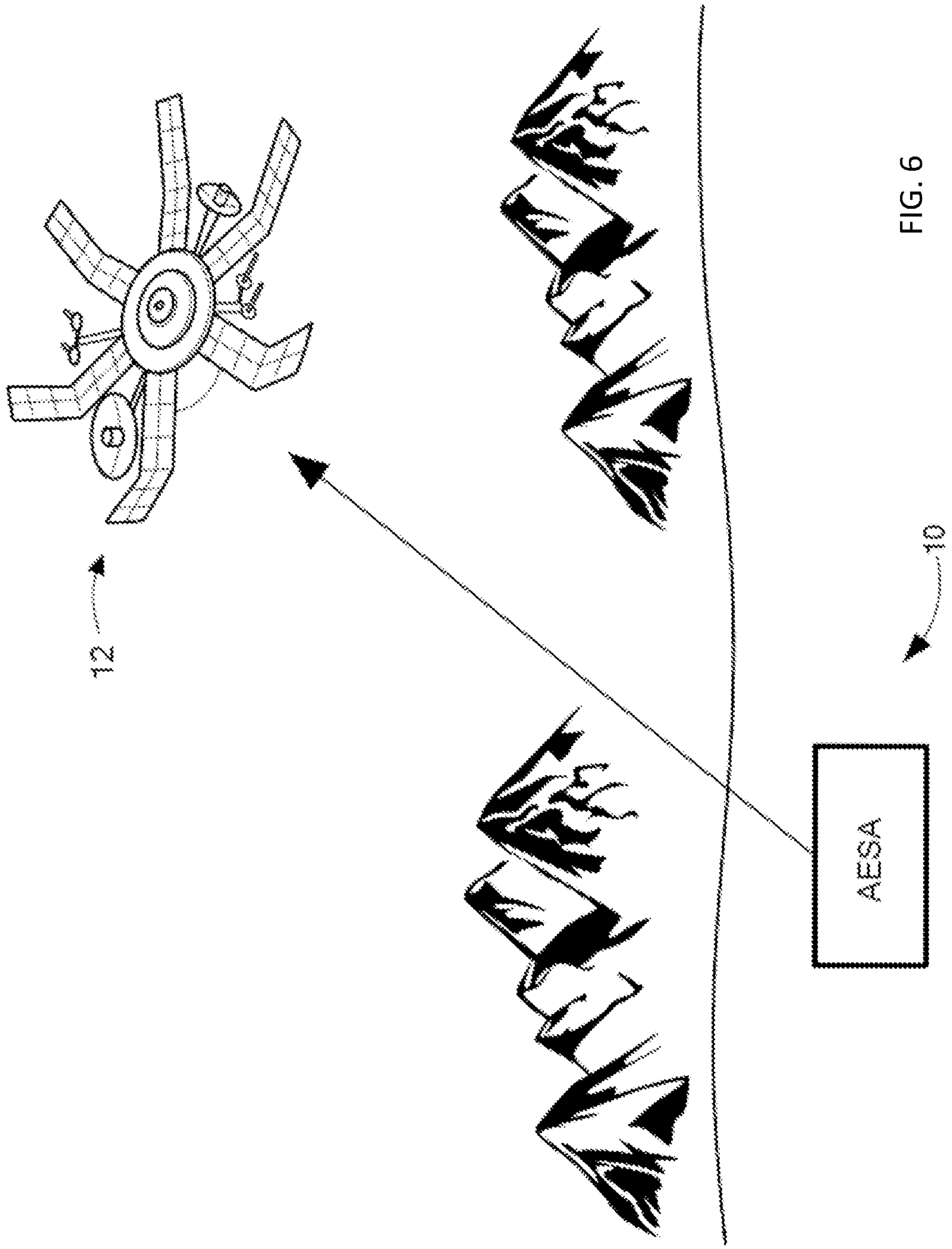
FIG. 6 schematically shows an active electronically steered antenna system ("AESA system") configured in accordance with certain illustrative embodiments of the invention and communicating with an orbiting satellite.

FIG. 6 schematically shows an active electronically steered antenna system ("AESA system 10") configured in accordance with certain illustrative embodiments of the invention and communicating with an orbiting satellite 12. A phased array (discussed in more detail below and referenced as phased array 10A) implements the primary functionality of the AESA system 10. Specifically, as known by those skilled in the art, a phased array is a system that includes a plurality of beam forming elements and related control logic for producing and adapting beam-formed signals to form one or more of a plurality of electronically steerable beams that can be used for a wide variety of applications. As a satellite communication system, for example, the AESA system 10, preferably is configured operate at one or more satellite frequencies. Among others, those frequencies may include the Ka-band, Ku-band, and/or X-band. Of course, as satellite communication technology progresses, future implementations may modify the frequency bands to communicate using new satellite frequencies.

Figure 7:
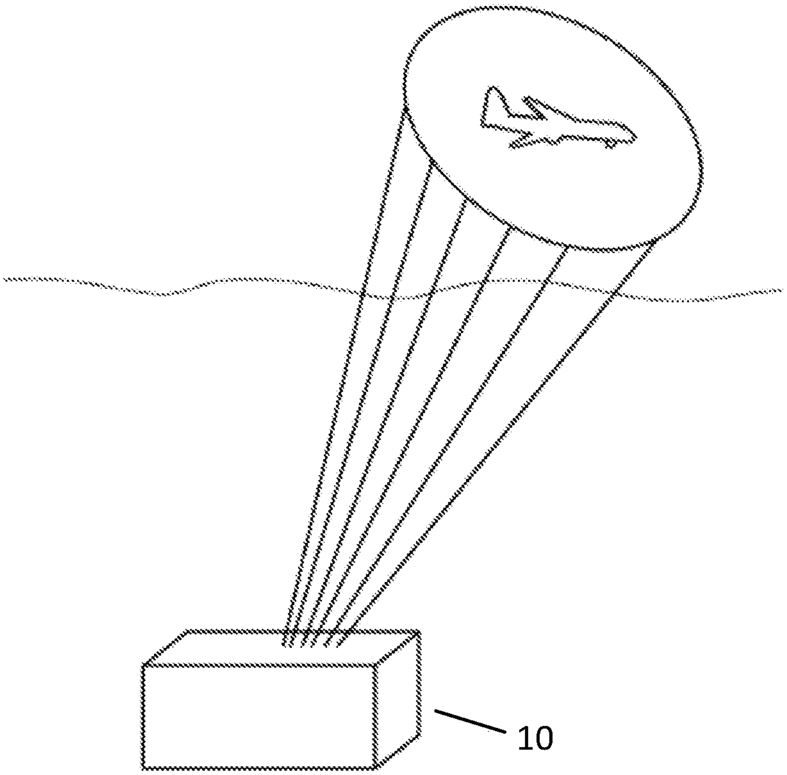
FIG. 7 schematically shows an AESA system configured in accordance with certain illustrative embodiments of the invention and implemented as a radar system in which a beam-formed signal may be directed toward an aircraft or other object in the sky (e.g., to detect or track position of the object).

FIG. 7 schematically shows an AESA system 10 configured in accordance with certain illustrative embodiments of the invention and implemented as a radar system in which a beam-formed signal may be directed toward an aircraft or other object in the sky (e.g., to detect or track position of the object).

Figure 8:
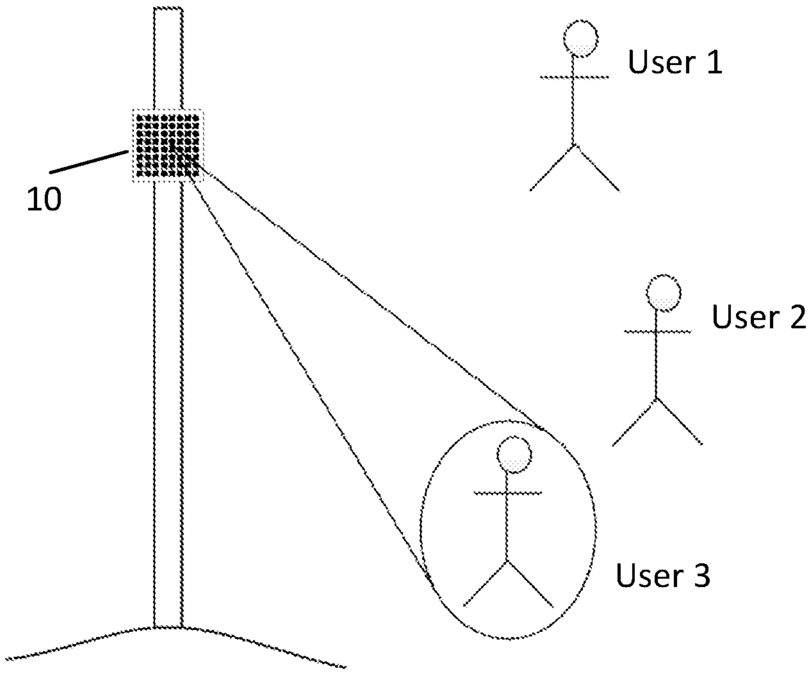
FIG. 8 schematically shows an AESA system configured in accordance with certain illustrative embodiments of the invention and implemented as a wireless communication system (e.g., 5G) in which a beam-formed signal may be directed toward a particular user (e.g., to increase the effective transmit range of the AESA system or to allow for greater frequency reuse across adjacent or nearby cells).

FIG. 8 schematically shows an AESA system 10 configured in accordance with certain illustrative embodiments of the invention and implemented as a wireless communication system (e.g., 5G) in which a beam-formed signal may be directed toward a particular user (e.g., to increase the effective transmit range of the AESA system or to allow for greater frequency reuse across adjacent or nearby cells). Of course, other implementations may include other types of wireless communication systems.

Of course, those skilled in the art use AESA systems 10 and other phased array systems in a wide variety of other applications, such as RF communication, optics, sonar, ultrasound, etc. Accordingly, discussion of satellite, radar, and wireless communication systems are not intended to limit all embodiments of the invention.

The satellite communication system may be part of a cellular network operating under a known cellular protocol, such as the 3G, 4G (e.g., LTE), or 5G protocols. Accordingly, in addition to communicating with satellites, the system may communicate with earth-bound devices, such as smartphones or other mobile devices, using any of the 3G, 4G, or 5G protocols. As another example, the satellite communication system may transmit/receive information between aircraft and air traffic control systems. Of course, those skilled in the art may use the AESA system 10 in a wide variety of other applications, such as broadcasting, optics, radar, etc. Some embodiments may be configured for non-satellite communications and instead communicate with other devices, such as smartphones (e.g., using 4G or 5G protocols). Accordingly, discussion of communication with orbiting satellites 12 is not intended to limit all embodiments of the invention.

In certain exemplary embodiments, the beam forming elements may be implemented as patch antennas that are formed on one side of a laminar printed circuit board, although it should be noted that the present invention is not limited to patch antennas or to a laminar printed circuit board. In exemplary embodiments, a phased array includes X beam forming integrated circuits (BFICs), with each BFIC supporting Y beam forming elements (e.g., 2 or 4 beam forming elements per BFIC, although not limited to 2 or 4). Thus, such a phased array includes (X*Y) beam forming elements.

Figure 9:
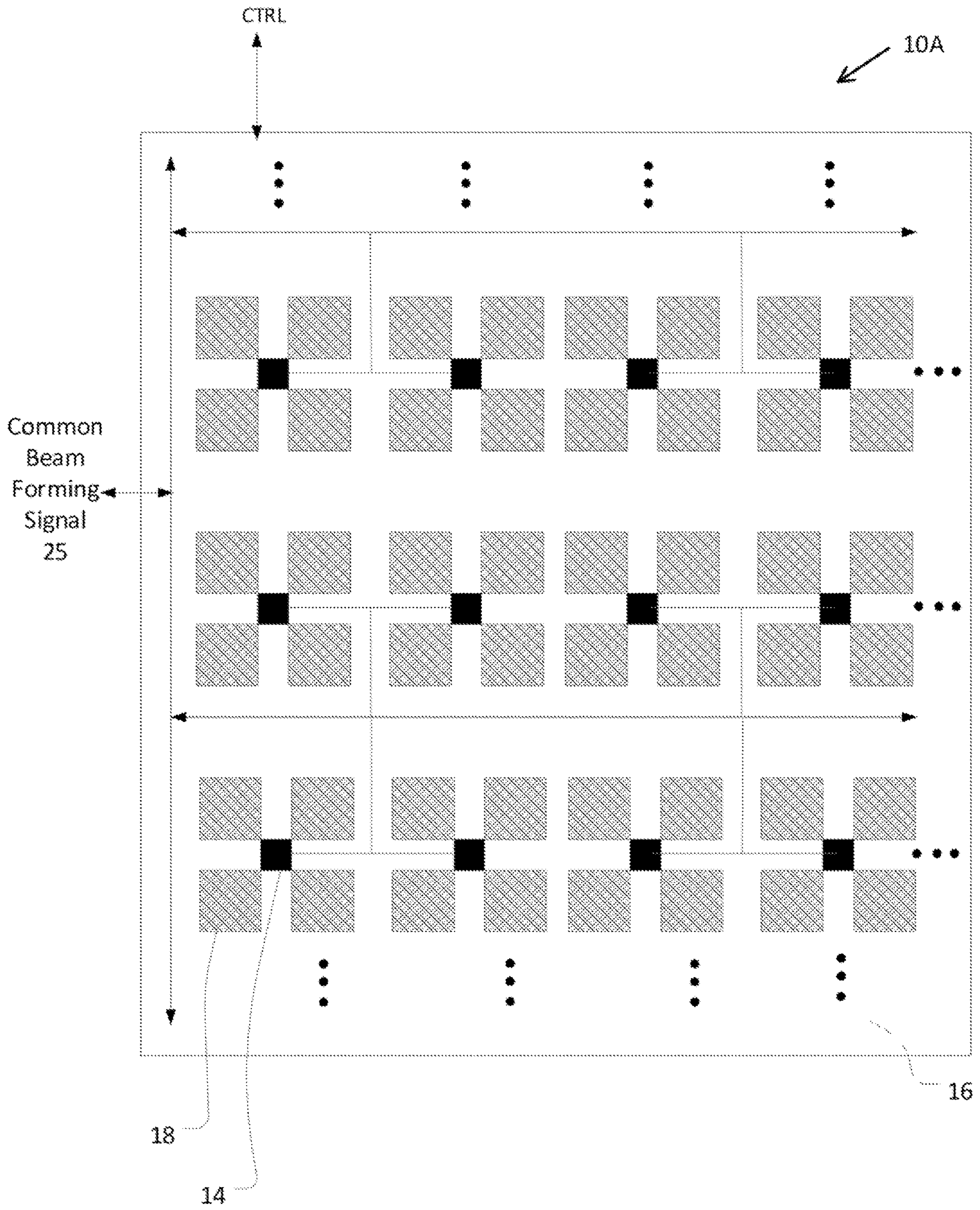
FIG. 9 schematically shows a plan view of a primary portion of an AESA system in which each beam forming integrated circuit (BFIC) is connected to four beam forming elements, in accordance with illustrative embodiments of the invention.
Figure 10:
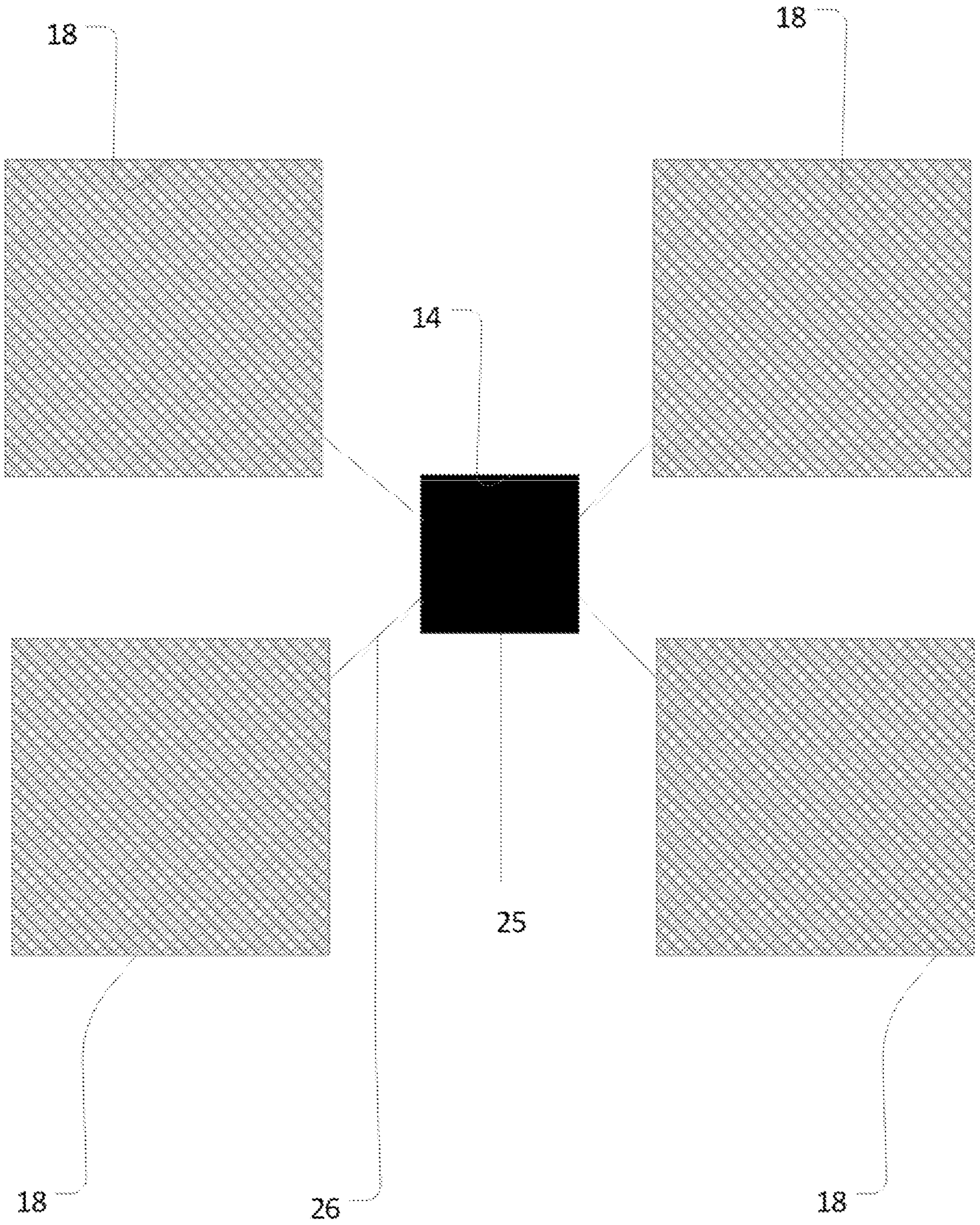
FIG. 10 schematically shows a close-up of a portion of the phased array of FIG. 9.

FIG. 9 schematically shows a plan view of a primary portion of an AESA system 10 in which each beam forming integrated circuit 14 is connected to four beam forming elements 18, in accordance with illustrative embodiments of the invention. Each BFIC 14 aggregates signals to/from the connected beam forming elements as part of a common beam forming signal 25. FIG. 10 schematically shows a close-up of a portion of the phased array 10A of FIG. 9.

Specifically, the AESA system 10 of FIG. 9 is implemented as a laminar phased array 10A having a laminated printed circuit board 16 (i.e., acting as the substrate and also identified by reference number "16") supporting the above noted plurality of beam forming elements 18 and beam forming integrated circuits 14. The elements 18 preferably are formed as a plurality of square or rectangular patch antennas oriented in a patch array configuration. It should be noted that other embodiments may use other patch configurations, such as a triangular configuration in which each integrated circuit is connected to three elements 18, a pentagonal configuration in which each integrated circuit is connected to five elements 18, or a hexagonal configuration in which each integrated circuit is connected to six elements 18. Like other similar phased arrays, the printed circuit board 16 also may have a ground plane (not shown) that electrically and magnetically cooperates with the elements 18 to facilitate operation. In exemplary embodiments, the BFICs are mounted to a back side of the printed circuit board opposite the side containing the patch antennas (e.g., with through-PCB vias and traces that connect to the elements 18, with such connections typically made using impedance controlled lines and transitions), although in alternative embodiments, the BFICs may be mounted to the same side of the printed circuit board as the patch antennas.

As a patch array, the elements 18 have a low profile. Specifically, as known by those skilled in the art, a patch antenna (i.e., the element 18) typically is mounted on a flat surface and includes a flat rectangular sheet of metal (known as the patch and noted above) mounted over a larger sheet of metal known as a "ground plane." A dielectric layer between the two metal regions electrically isolates the two sheets to prevent direct conduction. When energized, the patch and ground plane together produce a radiating electric field. Illustrative embodiments may form the patch antennas using conventional semiconductor fabrication processes, such as by depositing one or more successive metal layers on the printed circuit board 16. Accordingly, using such fabrication processes, each radiating element 18 in the phased array 10A should have a very low profile. It should be noted that embodiments of the present invention are not limited to rectangular-shaped elements 18 but instead any appropriate shape such as circular patches, ring resonator patches, or other shape patches may be used in other particular embodiments.

The phased array 10A can have one or more of any of a variety of different functional types of elements 18. For example, the phased array 10A can have transmit-only elements 18, receive-only elements 18, and/or dual mode receive and transmit elements 18 (referred to as "dual-mode elements 18"). The transmit-only elements 18 are configured to transmit outgoing signals (e.g., burst signals) only, while the receive-only elements 18 are configured to receive incoming signals only. In contrast, the dual-mode elements 18 are configured to either transmit outgoing burst signals, or receive incoming signals, depending on the mode of the phased array 10A at the time of the operation. Specifically, when using dual-mode elements 18, the phased array 10A generally can be in either a transmit mode, or a receive mode.

The AESA system 10 has a plurality of the above noted integrated circuits 14 (mentioned above with regard to FIG. 10) for controlling operation of the elements 18. Those skilled in the art sometimes refer to these integrated circuits 14 as "beam steering integrated circuits." Each integrated circuit 14 preferably is configured with at least the minimum number of functions to accomplish the desired effect. Indeed, integrated circuits 14 for dual mode (transmit and receive) elements 18 are expected to have some different functionality than that of the integrated circuits 14 for transmit-only elements 18 or receive-only elements 18. Accordingly, integrated circuits 14 for such non-dual-mode elements 18 typically have a smaller footprint than the integrated circuits 14 that control the dual-mode elements 18. Despite that, some or all types of integrated circuits 14 fabricated for the phased array 10A can be modified to have a smaller footprint.

As an example, depending on its role in the phased array 10A, each integrated circuit 14 may include some or all of the following functions:

phase shifting, amplitude controlling/beam weighting, switching between transmit mode and receive mode, output amplification to amplify output signals to the elements 18, input amplification for received RF signals (e.g., signals received from the satellite 12), and power combining/summing and splitting between elements 18.

Indeed, some embodiments of the integrated circuits 14 may have additional or different functionality, although illustrative embodiments are expected to operate satisfactorily with the above noted functions. Those skilled in the art can configure the integrated circuits 14 in any of a wide variety of manners to perform those functions. For example, the input amplification may be performed by a low noise amplifier, the phase shifting may use conventional active phase shifters, and the switching functionality may be implemented using conventional transistor-based switches. Additional details of the structure and functionality of integrated circuits 14 are discussed below.

In illustrative embodiments, multiple elements 18 share the integrated circuits 14, thus reducing the required total number of integrated circuits 14. This reduced number of integrated circuits 14 correspondingly reduces the cost of the AESA system 10. In addition, more surface area on the top face of the printed circuit board 16 may be dedicated to the elements 18.

To that end, each integrated circuit 14 preferably operates on at least one element 18 in the array and typically operates on a plurality of elements 18. For example, as discussed above, one integrated circuit 14 can operate on two, three, four, five, six, or more different elements 18. Of course, those skilled in the art can adjust the number of elements 18 sharing an integrated circuit 14 based upon the application. For example, a single integrated circuit 14 can control two elements 18, three elements 18, four elements 18, five elements 18, six elements 18, seven elements 18, eight elements 18, etc., or some range of elements 18. Sharing the integrated circuits 14 between multiple elements 18 in this manner reduces the required total number of integrated circuits 14, correspondingly reducing the required size of the printed circuit board 16 and cost of the system.

As noted above, dual-mode elements 18 may operate in a transmit mode, or a receive mode. To that end, the integrated circuits 14 may generate time division diplex or duplex waveforms so that a single aperture or phased array 10A can be used for both transmitting and receiving. In a similar manner, some embodiments may eliminate a commonly included transmit/receive switch in the side arms (discussed below) of the integrated circuit 14. Instead, such embodiments may duplex at the element 18. This process can be performed by isolating one of the elements 18 between transmit and receive by an orthogonal feed connection. Such a feed connection may eliminate about a 0.8 dB switch loss and improve G/T (i.e., the ratio of the gain or directivity to the noise temperature) by about 1.3 dB for some implementations.

RF interconnect and/or beam forming lines 26 electrically connect the integrated circuits 14 to their respective elements 18. To further minimize the feed loss, illustrative embodiments mount the integrated circuits 14 as close to their respective elements 18 as possible. Specifically, this close proximity preferably reduces RF interconnect line lengths, reducing the feed loss. To that end, each integrated circuit 14 preferably is packaged either in a flip-chipped configuration using wafer level chip scale packaging (WLCSP) or other configuration such as extended wafer level ball-grid-array (eWLB) that supports flip chip, or a traditional package, such as quad flat no-leads package (QFN package).

It should be reiterated that although FIG. 9 shows an exemplary AESA system 10 with some specificity (e.g., specific layouts of the elements 18 and integrated circuits 14), those skilled in the art may apply illustrative embodiments to other implementations. For example, as noted above, each integrated circuit 14 can connect to more or fewer elements 18, or the lattice configuration can be different. Accordingly, discussion of the specific configurations of the AESA system 10 shown in FIG. 9 is for convenience only and not intended to limit all embodiments.

Figure 11:
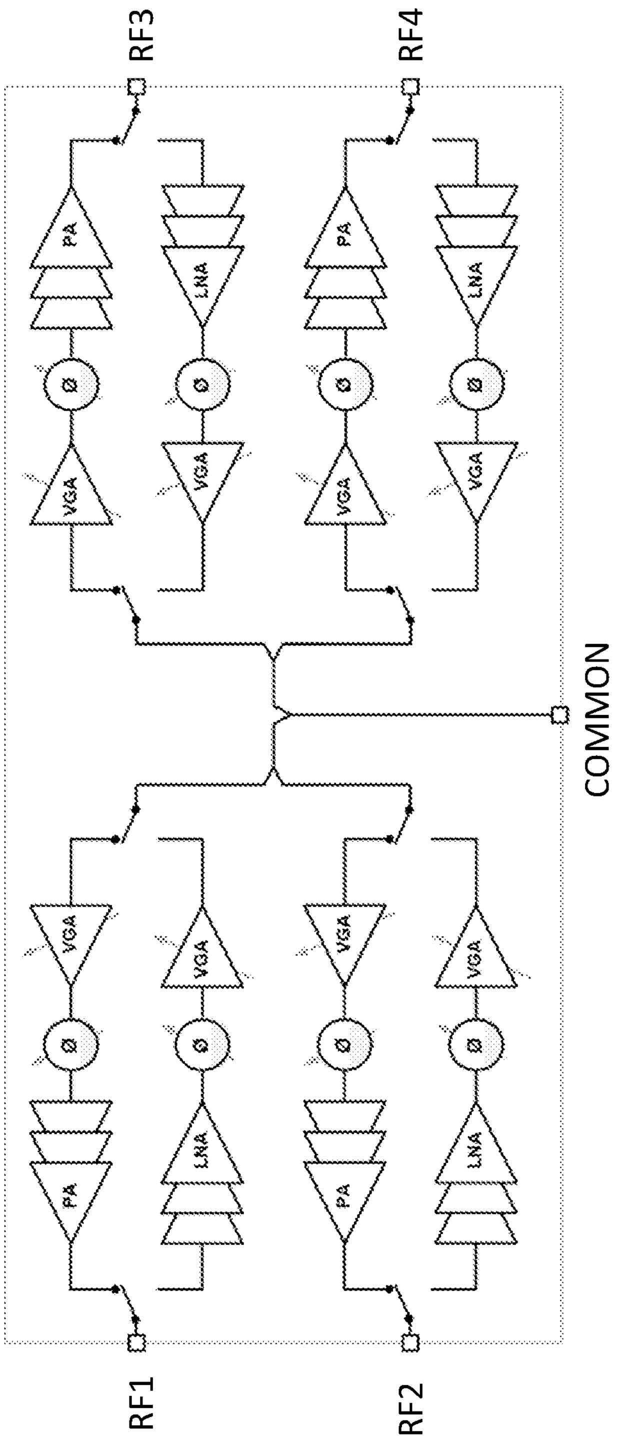
FIG. 11 is a high-level schematic diagram of a four-channel dual-mode BFIC chip in accordance with one exemplary embodiment.

FIG. 11 is a high-level schematic diagram of a four-channel dual-mode BFIC chip in accordance with one exemplary embodiment. Here, each channel has a transmit gain/phase control circuit and a receive gain/phase control circuit that can be switched into and out of the common beam forming signal 25. The transmit gain/phase control circuit includes a variable gain amplifier (VGA), an adjustable phase circuit (Ø), and a power amplifier (PA) stage. The receive gain/phase control circuit includes a low noise amplifier (LNA) stage, an adjustable phase circuit (Ø), and a variable gain amplifier (VGA). In FIG. 11, the BFIC chip is shown with the switches configured in a transmit mode, such that common beam forming signal 25 provided to the BFIC chip is distributed to the four channels. The BFIC chip can be configured in a receive mode by changing the position of the switches, such that signals received on the four channels are output by the BFIC chip as common beam forming signal 25.

Figure 12:
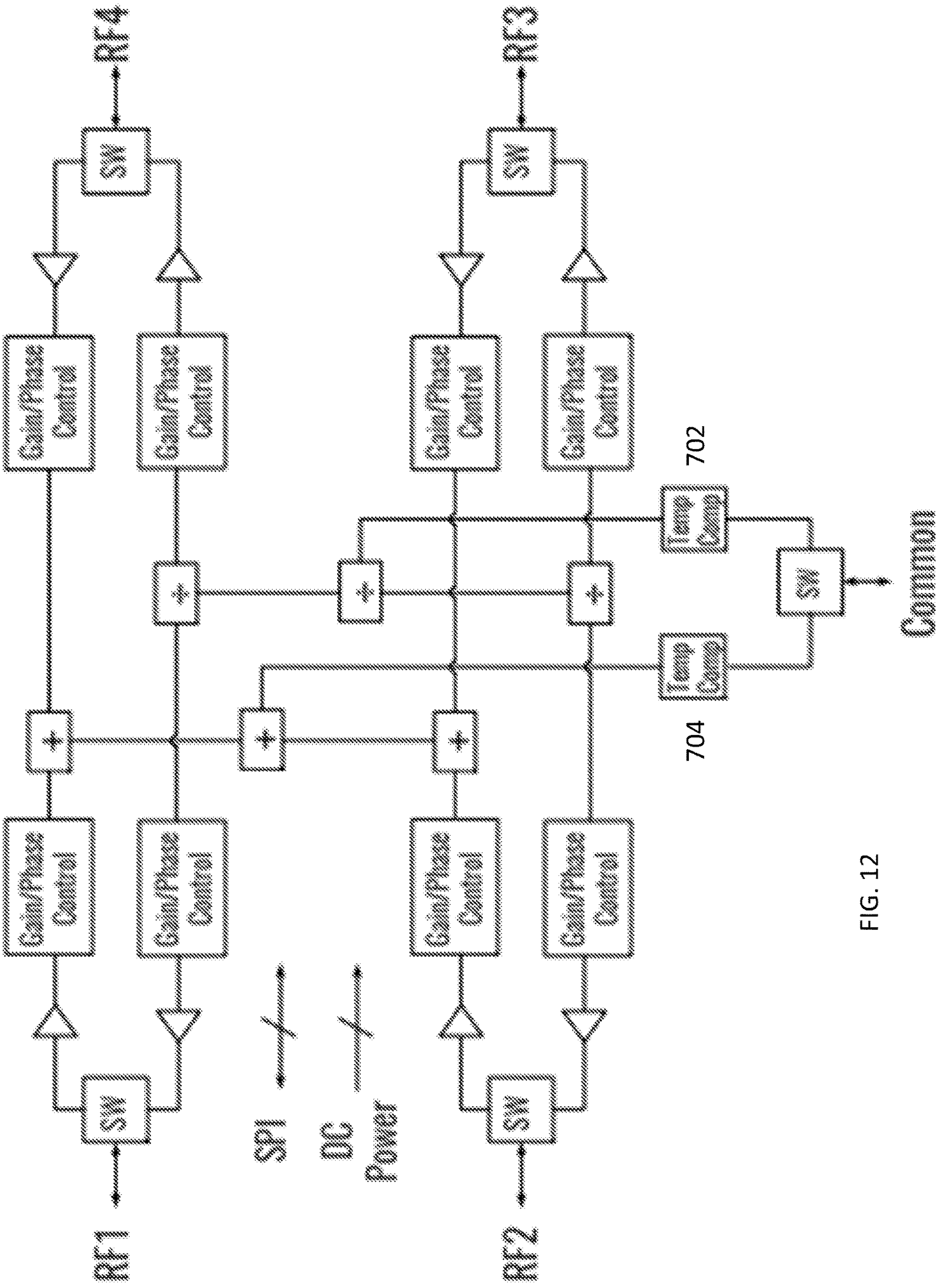
FIG. 12 is a detailed schematic diagram of the BFIC chip of FIG. 11, in accordance with one exemplary embodiment.

FIG. 12 is a detailed schematic diagram of the BFIC chip of FIG. 11, in accordance with one exemplary embodiment. In this exemplary embodiment, the BFIC chip includes temperature compensation (Temp Comp) circuitry to adjust the gain of the transmit and receive signals as a function of temperature based on inputs from a temperature sensor, although alternative embodiments may omit temperature compensation circuitry. In one exemplary embodiment, each Temp Comp circuit includes a digital attenuator that is controlled based on the sensed temperature. Specifically, in this exemplary embodiment, when temperature decreases such that the gain would increase, attenuation is increased in order provide the desired amount of gain, and when temperature increases such that gain would decrease, attenuation is decreased in order to provide the desired amount of gain. In the exemplary embodiment represented in FIG. 12, temperature compensation is performed on the transmit signal prior to distribution to the four RF channels by Temp Comp circuit 702 and is performed on the combined receive signal by Temp Comp circuit 704. In various alternative embodiments, temperature compensation may be performed in other ways, such as, for example, by controlling of the gain of the transmit and receive RF amplifiers.

It should be noted that embodiments of the present invention may employ conventional components such as conventional programmable logic devices (e.g., off-the shelf FPGAs or PLDs) or conventional hardware components (e.g., off-the-shelf ASICs or discrete hardware components) which, when programmed or configured to perform the non-conventional functions described herein, produce non-conventional devices or systems. Thus, there is nothing conventional about the inventions described herein because even when embodiments are implemented using conventional components, the resulting devices and systems (e.g., TDC devices and circuits) are necessarily non-conventional because, absent special programming or configuration, the conventional components do not inherently perform the described non-conventional functions.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Various inventive concepts may be embodied as one or more methods, of which examples have been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein in the specification and in the claims, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

Although the above discussion discloses various exemplary embodiments of the invention, it should be apparent that those skilled in the art can make various modifications that will achieve some of the advantages of the invention without departing from the true scope of the invention. Any references to the "invention" are intended to refer to exemplary embodiments of the invention and should not be construed to refer to all embodiments of the invention unless the context otherwise requires. The described embodiments are to be considered in all respects only as illustrative and not restrictive.

What is claimed is:

1. A time-to-digital conversion system comprising:

a first circuitry configured to capture a time difference between two signals as a voltage; and a second circuitry configured to produce a digital output value representative of the time difference between the two signals based on the voltage, wherein:

the first circuitry comprises a time-to-voltage converter circuit configured to output a voltage signal that is proportional to the time difference between the two signals and a voltage measurement circuit configured to output a voltage measurement value based on the voltage signal; and the second circuitry comprises a mapping circuit configured to output a time value based on the voltage measurement value as the digital output value.

2. The system according to claim 1, comprising:

an integrated circuit that includes the first circuitry; and an apparatus, separate from the integrated circuit, that includes the second circuitry.

3. The system according to claim 1, wherein the time-to-voltage converter circuit comprises:

an integrate-and-dump circuit.

4. The system according to claim 1, wherein the time-to-voltage converter circuit comprises:

a controllable current source configured to start an output current flow in response to a first signal of the two signals and to stop the current output flow in response to a second signal of the two signals; and a capacitive circuit coupled to the controllable current source and configured to store voltage based on the current output flow from the controllable current source.

5. The system according to claim 4, wherein:

the controllable current source comprises a flip-flop circuit or a latch circuit; and the capacitive circuit comprises a capacitor, a capacitor network, or an integrate-and-dump circuit.

6. The system according to claim 1, wherein the time-to-voltage converter circuit comprises:

a flip-flop circuit configured to produce a start signal in response to a first signal of the two signals and to produce a stop signal in response to a second signal of the two signals; and an integrate-and-dump circuit configured to begin integrating on the start signal and to stop integrating on the stop signal.

7. The system according to claim 1, wherein the voltage measurement circuit comprises an analog-to-digital converter to quantize the voltage signal.

8. The system according to claim 1, wherein the mapping circuit implements a transfer function circuit that maps the voltage measurement value to a corresponding time value.

9. The system according to claim 1, wherein the mapping circuit comprises a mapping table that maps voltage measurement values to corresponding time values such that the mapping table can be indexed by the voltage value to obtain the corresponding time value.

10. The system according to claim 1, wherein the voltage corresponds to a voltage increase during the time difference.

11. The system according to claim 1, wherein the voltage corresponds to a voltage drop during the time difference.

12. The system according to claim 1, wherein the digital output value corresponds to a phase offset between the two signals.

13. The system according to claim 1, comprising an integrated circuit that includes the first circuitry and the second circuitry.

14. A time-to-digital conversion method comprising:

capturing a time difference between two signals as a voltage; and producing a digital output value representative of the time difference between the two signals based on the voltage, wherein:

capturing a time difference between two signals as a voltage comprises producing a voltage signal that is proportional to the time difference between the two signals; and producing a digital output value representative of the time difference between the producing a digital output value representative of the time difference between the two signals based on the voltage comprises producing a voltage measurement value based on the voltage signal and outputting a time value based on the voltage measurement value as the digital output value.

15. The method according to claim 14, wherein the digital output value corresponds to a phase offset between the two signals.

16. The method according to claim 14, wherein the voltage corresponds to a voltage drop during the time difference.

17. The method according to claim 14, wherein producing a voltage signal that is proportional to the time difference between the two signals comprises:

starting a voltage capture operation in response to a first signal of the two signals; and stopping the voltage capture operation in response to a second signal of the two signals.

18. The method according to claim 14, wherein the voltage corresponds to a voltage increase during the time difference.

* * * * *